United States Patent
Hamweendo et al.

(10) Patent No.: US 10,211,126 B2
(45) Date of Patent: Feb. 19, 2019

(54) METHOD OF MANUFACTURING AN OBJECT WITH MICROCHANNELS PROVIDED THERETHROUGH

(71) Applicant: UNIVERSITY OF THE WITWATERSRAND, JOHANNESBURG, Johannesburg (ZA)

(72) Inventors: Agripa Hamweendo, Lusaka (ZM); Ionel Botef, Johannesburg (ZA)

(73) Assignee: UNIVERSITY OF THE WITWATERSRAND, JOHANNESBURG, Johannesburg (ZA)

( * ) Notice: Subject to any disclaimer, the term of this patent is extended or adjusted under 35 U.S.C. 154(b) by 0 days.

(21) Appl. No.: 15/518,853

(22) PCT Filed: Oct. 13, 2015

(86) PCT No.: PCT/IB2015/057821
§ 371 (c)(1),
(2) Date: Apr. 13, 2017

(87) PCT Pub. No.: WO2016/059547
PCT Pub. Date: Apr. 21, 2016

(65) Prior Publication Data
US 2017/0250122 A1    Aug. 31, 2017

(30) Foreign Application Priority Data
Oct. 14, 2014    (ZA) ................................ 2014/07434

(51) Int. Cl.
*H01L 23/46*    (2006.01)
*B81C 1/00*    (2006.01)
(Continued)

(52) U.S. Cl.
CPC .......... *H01L 23/46* (2013.01); *B81C 1/00071* (2013.01); *C23C 24/04* (2013.01);
(Continued)

(58) Field of Classification Search
CPC .... C23C 24/04; C23F 1/00; C23F 1/02; F28F 2260/02; F28F 3/12; H01L 21/4878;
(Continued)

(56) References Cited

U.S. PATENT DOCUMENTS 6,209,199 B1 *    4/2001    Cornu ................... B23P 15/008
                                                        29/889.7
7,624,910 B2 *    12/2009    Barnes ............... B23K 20/1225
                                                        228/112.1
(Continued)

OTHER PUBLICATIONS

Written Opinion of the International Searching Authority for PCT/IB2015/057821.
(Continued)

*Primary Examiner* — Lan Vinh
(74) *Attorney, Agent, or Firm* — Baker Donelson

(57) ABSTRACT

This invention relates to a method of manufacturing an object with microchannels provides therethrough, and more particularly, but not exclusively, to a method of manufacturing a micro heat exchanger with microchannels provided therethrough. The method includes the steps of providing a metal base layer made from a first metal; forming a plurality of spaced apart ridges, made from a second metal, on the base layer; depositing more of the first metal onto the ridges in order to cover the ridges; and removing the ridges using a chemical etching process so as to produce microchannels in a body made of the first metal.

16 Claims, 7 Drawing Sheets

(51) Int. Cl.
| | |
|---|---|
| *C23C 24/04* | (2006.01) |
| *C23F 1/00* | (2006.01) |
| *F28F 3/12* | (2006.01) |
| *H01L 21/48* | (2006.01) |
| *C23F 1/02* | (2006.01) |
| *H01L 23/467* | (2006.01) |
| *H01L 23/473* | (2006.01) |

(52) U.S. Cl.
CPC .................. *C23F 1/00* (2013.01); *F28F 3/12* (2013.01); *H01L 21/4878* (2013.01); *C23F 1/02* (2013.01); *F28F 2260/02* (2013.01); *H01L 23/467* (2013.01); *H01L 23/473* (2013.01)

(58) Field of Classification Search
CPC ....... H01L 23/40; H01L 23/467; H01L 23/46; H01L 23/473; H01L 21/48; B81C 1/00071
USPC ...... 216/39, 40, 41; 438/427, 435, 700, 675, 438/672
See application file for complete search history.

(56) References Cited

U.S. PATENT DOCUMENTS

| | | | |
|---|---|---|---|
| 2004/0087162 | A1 | 5/2004 | Vogeli |
| 2011/0174040 | A1 | 7/2011 | Meng et al. |
| 2011/0193140 | A1* | 8/2011 | Fix ....................... G01N 27/414 257/253 |
| 2012/0040132 | A1* | 2/2012 | Eto ....................... B32B 15/016 428/131 |
| 2012/0196442 | A1* | 8/2012 | Deng .................. H01L 21/3212 438/693 |
| 2014/0186229 | A1* | 7/2014 | Tonkovich ........... B01J 19/0093 422/187 |
| 2014/0251582 | A1* | 9/2014 | Lyon ....................... F28D 15/00 165/104.28 |

OTHER PUBLICATIONS

International Search Report for PCT/IB2015/057821.
Asgari, Omid, and Mohammad Hassan Saidi. "Approximate method of determining the optimum cross section of microhannel heat sink," Journal of mechanical science and technology 23.12 (2009): 3448-3458.
Gaikwad, V. P. "Microchannel heat sink fabrication techniques." IOSR Journal of Mechanical and Civil Engineering (2009): 51-57.
Gargi, H.. Negi, V. S., Nidhi, and Lail, A. K, 2013, Numerical Study of Microscale Heat Sinks Using Different Shapes & Fluids, Central Scientific Instruments Organisation (CSIR-CSD), Excerpt from the Proceedings of the 2013 COMSOL Conference in Bangalore, India.
Mihai, Ioan, "Heat transfer in minichannels and microchannels CPU cooling systems." Heat Transfer-Theoretical Analysis, Experimental Investigations and Industrial Systems, InTech, 2011.
Papyrin. A., Kosarev, V., klinkov, S., Alkhimov, A., and Fomin, V., 2006, Cold Spray Technology, Summer Universities, ENISE, St-Etienne, France.
Prakash, Shashi, and Subrata Kumar. "Fabrication of microchannels: A review." Proceedings of the Institution of Mechanical Engineers, Part B: Journal of Engineering Manufacture 229.8 (2015): 1273-1288.
Upadhya, Girish, et al. "Micro-scale liquid cooling system for high heat flux processor cooling applications." Semiconductor Thermal Measurement and Management Symposium, 2006 IEEE Twenty-Second Annual IEEE. IEEE, 2006.
Zhao, C. Y., and T. J. Lu. "Analysis of microchannel heat sinks tor electronics cooling." International Journal of Heat and Mass Transfer 45.24 (2002): 4857-4869.
Zhou, W., Deng, W., Lu, L., Zhang, J., Qin L., Ma, S., and Tang. Y., 2014, Laser micro-milling of Microchannel on copper sheet as catalyst support used in microreactor for hydrogen production, International Journal of Hydrogen Energy, vol. 39, pp. 4884-4894, ScienceDirect.

* cited by examiner

METHOD OF MANUFACTURING AN OBJECT WITH MICROCHANNELS PROVIDED THERETHROUGH

This application is a National Stage Application under 35 U.S.C. section 371 of PCT/IB2015/057821, filed Oct. 13, 2015, which claims priority from and the benefit of ZA Application No: 2014/07434 filed Oct. 14, 2014, the entire contents of each application are hereby incorporated by reference in their entireties.

BACKGROUND TO THE INVENTION

THIS invention relates to a method of manufacturing an object with microchannels provides therethrough, and more particularly, but not exclusively, to a method of manufacturing a micro heat exchanger with microchannels provided therethrough.

Microchannels are channels provided in various devices having any of the dimensions between 1 micron and 999 microns (Prakash and Kumar 2014), i.e. channels with a hydraulic diameter of less than 1 mm. Microchannels are primarily used in advanced biomedical, chemical, electronics, and mechanical engineering applications. Depending on the applications, microchannels have different shapes, sizes and structures and are fabricated from different substrate materials that exhibit properties preferable for a particular application.

For example, very fast and reliable compact computers require microprocessors with very high clock speed. However, the impediment of these advanced microprocessors is that they emit large heat flux densities which require novel cooling technologies in order to keep the temperature of the electronic components below critical levels (Zhao et al. 2002, Upadhya et al. 2006). At present, the heat flux densities emitted by microprocessors exceed the capability limit of the existing air cooling technologies that ultimately compromises the performance and reliability of the computers due to increased operation temperatures (Mihai 2011).

To address this problem, microfluidic cooling systems have been proposed as innovative thermal solutions for cooling the contemporary and next generation high speed computer microprocessors. Microfluidic cooling systems exhibit superior thermal extraction capabilities compared to other cooling technologies. In this regard, FIG. 1 presents the hierarchy of thermal extraction mechanisms performance, and shows how microfluidic cooling systems outperforms the other heat extraction systems.

A typical microfluidic cooling system is shown in FIG. 2 and comprises a micro heat sink, a micro pump, a micro condenser, and a fan. All these components operate on a closed loop micro-scale principle (Upadhya et al. 2006). During operation, the micro pump pumps the cooling liquid from the micro condenser to the micro heat sink, where the cooling liquid traverses the micro heat sink via the microchannels acting as heat transfer conduits. It is in these microchannels where the heat, which is conducted from the heat spreaders of the microprocessor, is transferred to the cooling liquid which in turn absorbs heat. The heated liquid then removes the heat to the micro condenser, where dissipation to the atmosphere occurs with the assistance of air cooling of the fan. The coordinated operation of these components accounts for the superior thermal performance of the microfluidic cooling systems (Upadhya et al. 2006).

Depending on the applications of microchannel-based devices, different types of materials are preferred. Polymeric and glass substrates are mostly used in biomedical and chemical devices, while silicon-based substrates and metallic substrates are used for electronics and mechanical engineering-related applications (Prakash and Kumar 2014). In recent years, polymeric substrate microfluidic devices started to exceed the use of silicon and glass substrates, mainly because of their low production costs and their high chemical resistance to an operating environment. Also, metallic microchannels have gained considerable attention as cooling devices in electronic and mechanical applications because many endothermic and exothermic reactions can be performed on such metallic substrates. The metallic microchannels can furthermore withstand corrosive environments, and can reach operating temperatures as high as 650° C. (Prakash and Kumar 2014).

A further important consideration is that shapes, sizes and structures of microchannels vary depending on the particular application for which it is to be used. Most common cross sections include rectangular microchannels, square microchannels, circular microchannels, half circular microchannels, U-shape microchannels and Gaussian beam shape microchannels (Prakash and Kumar 2014). Also, whilst most of the microfluidic channels have high area-to-volume aspect ratios, low area-to-volume aspect ratio channels are also not uncommon in applications such as particle separation devices (Prakash and Kumar 2014).

Studies have shown that different microchannels with different cross sections exhibits different heat removal performance, with the trapezoidal shape microchannels outperforming the other possible microchannels' shapes in terms of heat extraction capability (Asgari et al.). Also, this performance varies with the geometric dimensions of the microchannels (Gargi et al. 2013) which are also influenced by the technology used to fabricate those microchannels (Zhou et al. 2014). There is, however, a scarcity of micro heat sinks with trapezoidal channels due to the lack of robust microfabrication methods (Upadhya et al. 2006, Gargi et al. 2013).

The large scale fabrication of microchannels in typical substrates has always been a difficult task because of:
 (1) the precision required in the manufacturing of such products; and
 (2) the lack of suitable technologies to fabricate these devices (Prakash and Kumar 2014).

The methods used for fabricating different types of microchannels include both conventional and nonconventional fabrication techniques. However, the contemporary microfabrication technologies for microchannels could be broadly categorized as additive or subtractive, depending on whether the material is added or subtracted during the microfabrication process, as summarized in FIG. 3. The main groups of these technologies are:
 stereolithography,
 chemical etching; and
 micro-machining.

The most common fabrication processes for microchannels are discussed in more detail below.

Micro-machining of microchannels is particularly suitable for the fabrication of individual personalized components rather than fabrication of large batch sizes. This group of methodologies evolved as a result of the advent of ultra-precision machining tools that can achieve high level of machining accuracy at high machining speeds, whilst also resulting in good surface finish on a large number of materials, such as steel, aluminum, brass, or plastics and polymers (Prakash and Kumar 2014). Micro-machining is the most diverse category of microfabrication technologies and is composed of advanced micro milling, laser cutting, and electrical discharge machining (EDM) or a combination of these processes. These processes do not require a very expensive setup, which enables them to be used to produce micro-devices in small quantity and at a reasonable cost (Prakash and Kumar 2014).

Advanced micro milling has a drawback of limited tool geometries, which makes it difficult to fabricate microchannels with sizes below 500 μm. Laser technology, which uses a collimated laser beam to groove substrates, is a time consuming process which is not suitable for mass production and the technology cannot fabricate preset geometric dimensions due to laser interaction with the materials. The EDM method has the challenge of low rate of material removal and therefore is also not well suited for mass production of micro heat sinks (Zhou et al., 2014). A common drawback of all the micro-machining processes is therefore that it is not suitable for the high volume mass production of microchannel devices.

Chemical etching, the most widely used subtractive technique for micromachining, could be described as pattern transfer by chemical or physical removal of material from a substrate, often in a pattern defined by a protective mask layer such as a resist or an oxide (Prakash and Kumar 2014). Chemical etching could be wet or dry. In dry etching, mostly utilized for glass and polymer base materials, the surface can be physically etched in the gas or vapour phase by ion bombardment, can be etched by a chemical reaction at the surface, or can be etched by combining the physical and chemical mechanisms. Wet etching is suitable for metallic substrates that react well with chemicals, but the process results in non-parallel walls on the glass surface and, as the channel etches deeper, the walls are also etched (Prakash and Kumar 2014). In addition, chemical etching method has very low productivity and the process does not lend itself to precise control of the geometric dimensions of the fabricated microchannels.

Lithography is one of the major fabrication techniques used to fabricate microchannels. This process enables the fabrication of many different types of topographies that are difficult to generate using other fabrication techniques (Prakash and Kumar 2014). The most widely used form of lithography is where pattern transfer from mask onto thin films is done by photolithography. In recent times, X-ray lithography has also been used to create polymer microchannels that, in contrast with ion-beam lithography and electron beam lithography, do not require the presence of vacuum and clean room facilities, which makes this process cheaper and faster (Prakash and Kumar 2014). Furthermore, LIGA—the German abbreviation for Lithography, Galvanoformung (electroplating) and Abformung (Molding)) enables the precise manufacturing of high aspect ratio microchannels ranging from 100 to 1000 microns, and enables the use of new building materials and the fabrication of a wider dynamic range of dimensions and shapes (Prakash and Kumar 2014). However, its applicability is restricted by high costs, as well as the production of toxic waste (Zhou et al. 2014).

The above limitations of contemporary microfabrication technologies provide overwhelming evidence that, up to now, there has been no robust method for the mass microfabrication of microchannels with trapezoidal cross-sectional profiles. Therefore, new methods for faster and cheaper production of these devices must be explored for sustainable development in this area, in particular since there is a growing demand for microchannels with trapezoidal cross-section for use in micro heat exchangers.

It is accordingly an object of the invention to provide a method of manufacturing an object with microchannels provides therethrough that will, at least partially, alleviate the above disadvantages.

It is also an object of the invention to provide a method of manufacturing an object with microchannels provides therethrough, which will be a useful alternative to existing methods.

SUMMARY OF THE INVENTION

According to the invention there is provided a method of manufacturing an object with microchannels provided therethrough, the method including the steps of:
  providing a metal base layer made from a first metal;
  forming a plurality of spaced apart ridges, made from a second metal, on the base layer;
  depositing more of the first metal onto the ridges in order to cover the ridges; and
  removing the ridges using a chemical etching process so as to produce microchannels in a body made of the first metal.

There is provided for the ridges to be formed by depositing the second metal onto the base layer by way of a surface coating process.

Preferably, the second metal is deposited through a mask having parallel and spaced apart slots provided therethrough, in order to form the plurality of spaced apart ridges on the base layer.

There is provided for the sequence of depositing the first metal and the second metal to be repeated until a plurality of layers of ridges have been formed, before the ridges are removed by way of chemical etching so as to form a three dimensional network of microchannels in the first metal matrix.

A further intermediate step provides for the upper zones of the ridges to be removed before the step of depositing more of the first metal onto the ridges in order to cover the ridges.

Alternatively, the space between the ridges may first be filled by the first metal, following which the upper zones of the ridges, as well as the corresponding first metal located between the ridges, are then removed before the step of depositing more of the first metal onto the ridges in order to cover the ridges.

The upper zones of the ridges and/or the first metal layer may be removed by grinding, or any other suitable machining process.

There is provided for the ridges to be substantially triangular in cross-section.

There is further provided for the ridges to be substantially trapezoidal in cross-section once the upper zones or apexes of the ridges have been removed.

There is provided for the ridges to be of elongate configuration.

There is provided for the ridges to be parallel relative to one another.

The metal base layer may be in the form of a solid metal substrate made from the first metal.

Alternatively, the metal base layer may be formed by depositing one or more layers of the first metal by way of a surface coating process.

In a preferred embodiment the surface coating process will be a cold spraying process.

There is provided for the first metal to be selected from the group including copper, gold, silver, nickel, aluminium or any combination thereof.

There is provided for the second metal to be selected from the group including aluminium, zinc or copper.

In one embodiment of the invention the first metal is copper, and the second metal is aluminium.

In another embodiment of the invention the first metal is a copper/gold metal mixture, and the second metal is aluminium.

In a further embodiment of the invention the first metal is a copper/gold metal mixture, and the second metal is zinc.

In a further embodiment of the invention the first metal is silver, and the second metal is copper.

In a further embodiment of the invention the first metal is silver, and the second metal is aluminium.

In a further embodiment of the invention the first metal is nickel, and the second metal is zinc.

In a further embodiment of the invention the first metal is nickel, and the second metal is aluminium.

In a further embodiment of the invention the first metal is nickel, and the second metal is aluminium.

In a further embodiment of the invention the first metal is copper, and the second metal is zinc.

In a further embodiment of the invention the first metal is aluminium, and the second metal is zinc.

In a further embodiment of the invention the first metal is aluminium, and the second metal is copper.

There is provided for the manufactured object to be a micro heat exchanger.

It should be noted that, for the purposes of this specification, the term 'metal' may refer to single metal, or to a combination of metals.

BRIEF DESCRIPTION OF THE DRAWINGS

A preferred embodiment of the invention is described by way of a non-limiting example, and with reference to the accompanying drawings in which:

FIG. 8b shows a computational model of the heat sink of FIG. 8a; and

DETAILED DESCRIPTION OF INVENTION

Figure 1:
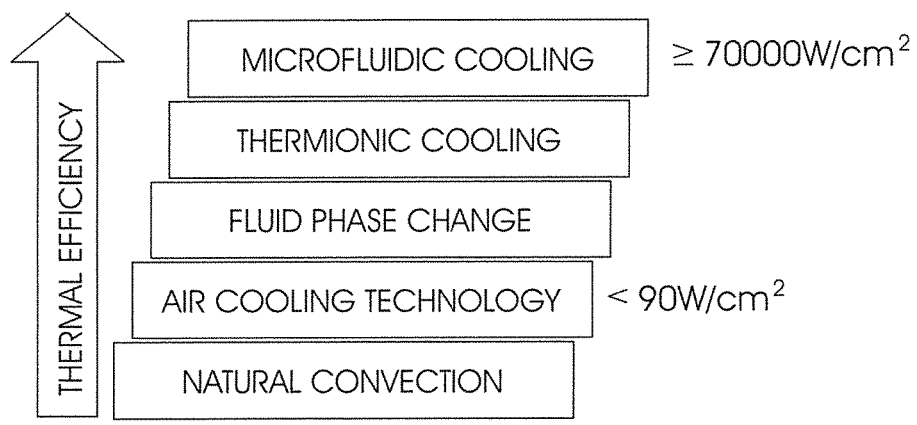
FIG. 1 is a representation of the thermal efficiency of a plurality of heat transfer mechanisms known in the art.
Figure 2:
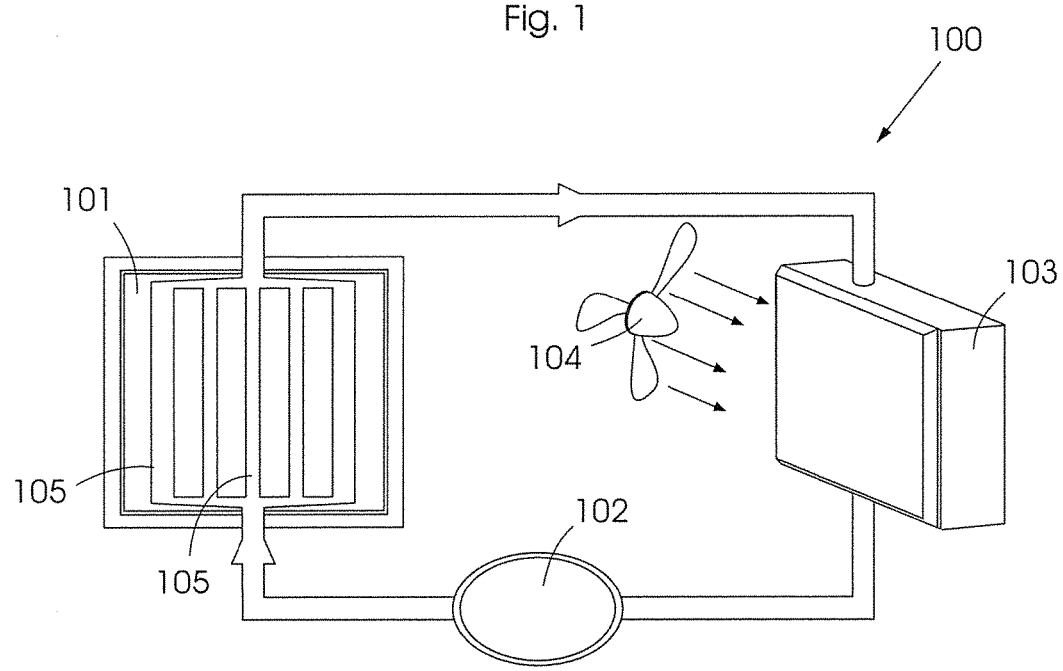
FIG. 2 is a schematic illustration of a micro-fluidic cooling system as is known in the art, and which incorporates a micro heat exchangers having microchannels provided therethrough.
Figure 3:
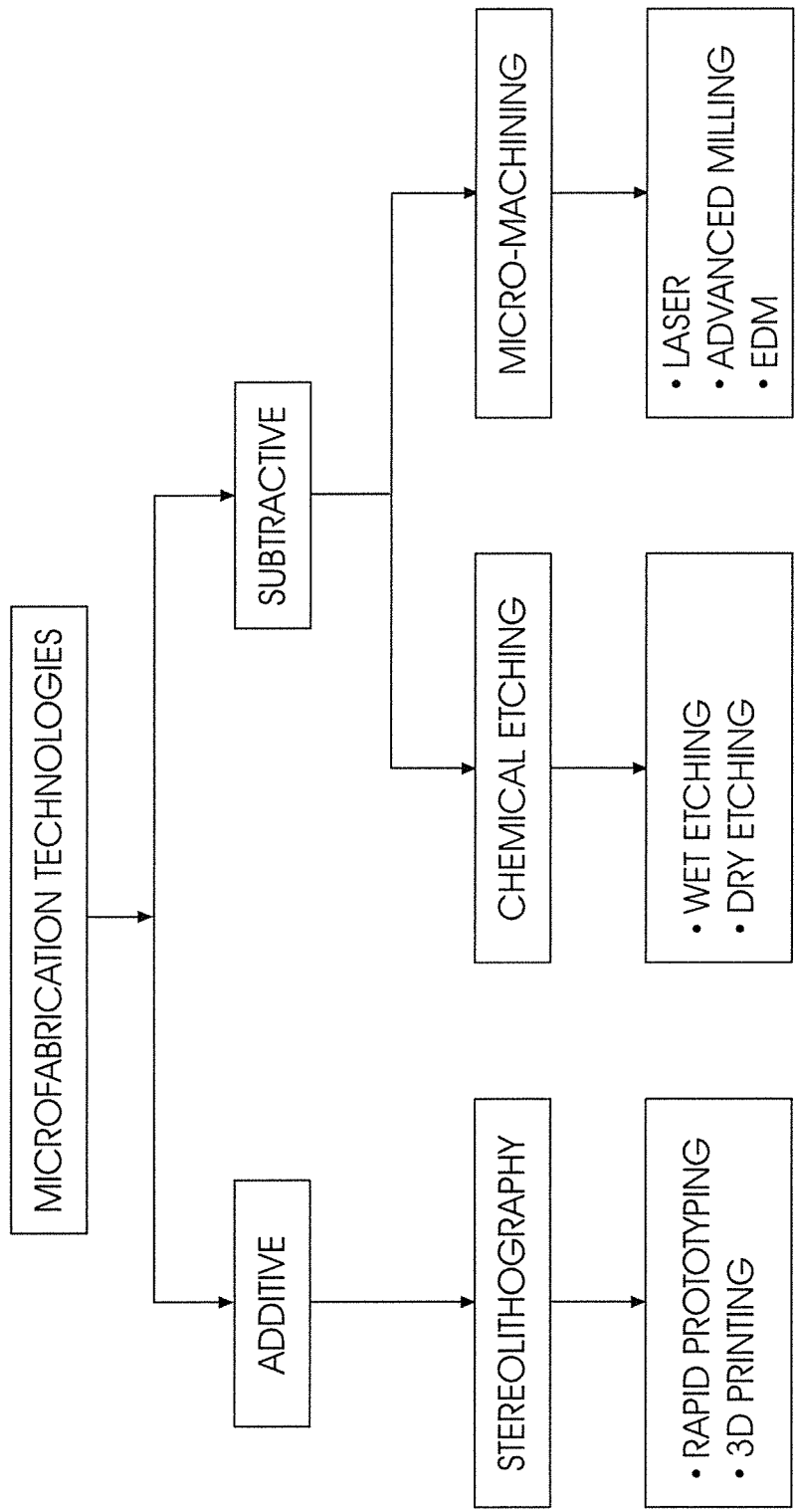
FIG. 3 provides a breakdown of microfabrication technologies known in the art.

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. The terminology includes the words specifically mentioned above, derivatives thereof, and words or similar import. It is noted that, as used in this specification and the appended claims, the singular forms "a," "an," and "the," and any singular use of any word, include plural referents unless expressly and unequivocally limited to one referent. As used herein, the term "include" and its grammatical variants are intended to be non-limiting, such that recitation of items in a list is not to the exclusion of other like items that can be substituted or added to the listed items.

Referring to the drawings, in which like numerals indicate like features, a non-limiting example of a method of manufacturing an object provided with microchannels therethrough in accordance with one embodiment of the invention is generally indicated by reference numeral 10.

In this particular embodiment, a cold spray technique is used as a material deposition methodology. Cold spraying is one of the most recent surface coating innovations through which it is possible to coat several metals by exposing a metallic or dielectric substrate to a high velocity (300-1200 m/s) jet of small (5-50 μm) particles accelerated by a supersonic stream of compressed and preheated gas (Papyrin et al.).

During the cold spraying process, the gas temperature is always lower than the melting point of the particle's material, so, upon impact on the substrate, these high-velocity 'cold' particles deform plastically and bond with the underlying material resulting in coating formation of the particles in their solid state. The deposition process takes place at temperature far below the melting point of the metal powders, and cold spraying is, therefore, a solid state deposition process that provides distinctive advantages when compared to the traditional thermal spraying processes. These advantages include (Papyrin et al.): high thermal/electrical conductivity of coatings; minimal oxidation and undesirable phases changes in coatings; retention of initial materials properties; low thermally induced residual stresses; capability to spray thermally sensitive materials; capability of coating highly dissimilar materials' combinations; needs minimum substrate surface preparation; high productivity due to high powder feed rate, automation and process adjustability; and a cost effective process due to high deposition efficiencies for many materials. As a result of these advantages, cold spraying has been selected to be used for the development of a novel method for the fabrication of microchannels.

Figure 4:
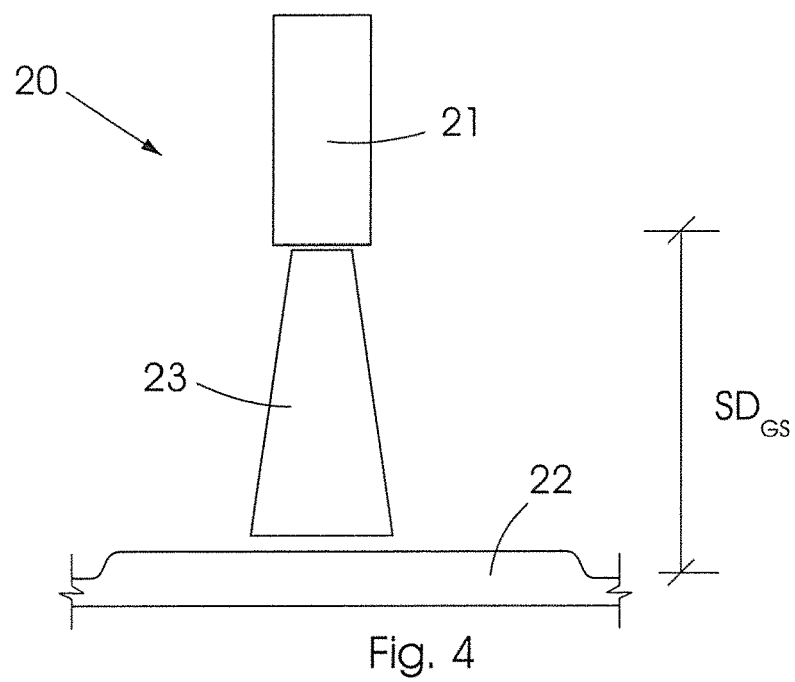
FIG. 4 shows the setup of a cold spray process used in the method of this invention, and in particular the cold spray process as configured to deposit a first metal used in the method.
Figure 5:
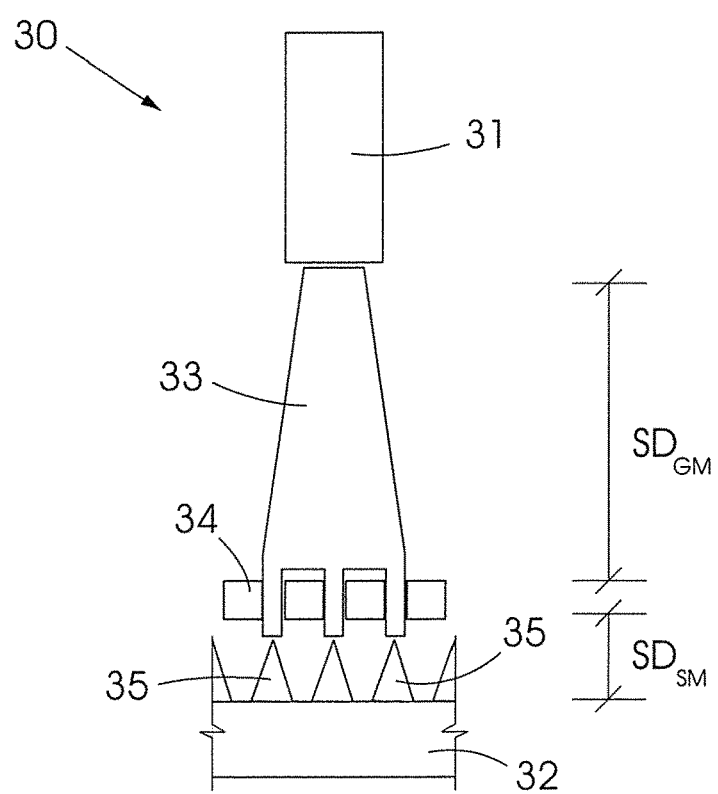
FIG. 5 shows the setup of the cold spray process used in the method of this invention, and in particular the cold spray process as configured to deposit a second metal used in the method.

Two cold spraying configurations are utilised during the method in accordance with the invention, and are shown in FIGS. 4 and 5.

FIG. 4 shows a cold spraying setup 20 where a gun 21 ejects a jet of a first metal powder 23, which is then deposited onto a substrate 22. The distance between the gun 21 and the substrate ($SD_{GS}$) is referred to as the standoff distance between the gun 21 and the substrate 22. In this setup no mask is provided between the gun 21 and the substrate 22.

FIG. 5 shows a further cold spraying setup where a gun 31 ejects a jet of a second metal powder 33, which is then deposited onto a substrate 32. However, in this case the jet 33 passes through a mask 34 having predetermined openings (in the form of spaced apart, parallel, elongate slots) provided therethrough, and the coating on the substrate 32 is therefore not uniform. Instead, a plurality of discrete ridges 35, or hillocks, are formed on the substrate 32. In this setup, the distance between the gun 31 and the mask 34 ($SD_{GM}$) is referred to as the standoff distance between the gun 31 and the mask 34, and the distance between the mask 34 and the substrate 32 ($SD_{MS}$) is referred to as the standoff distance between the mask 34 and the substrate 32. These two cold spraying setups are used in combination during the method that will now be described in more detail below.

Figure 6:
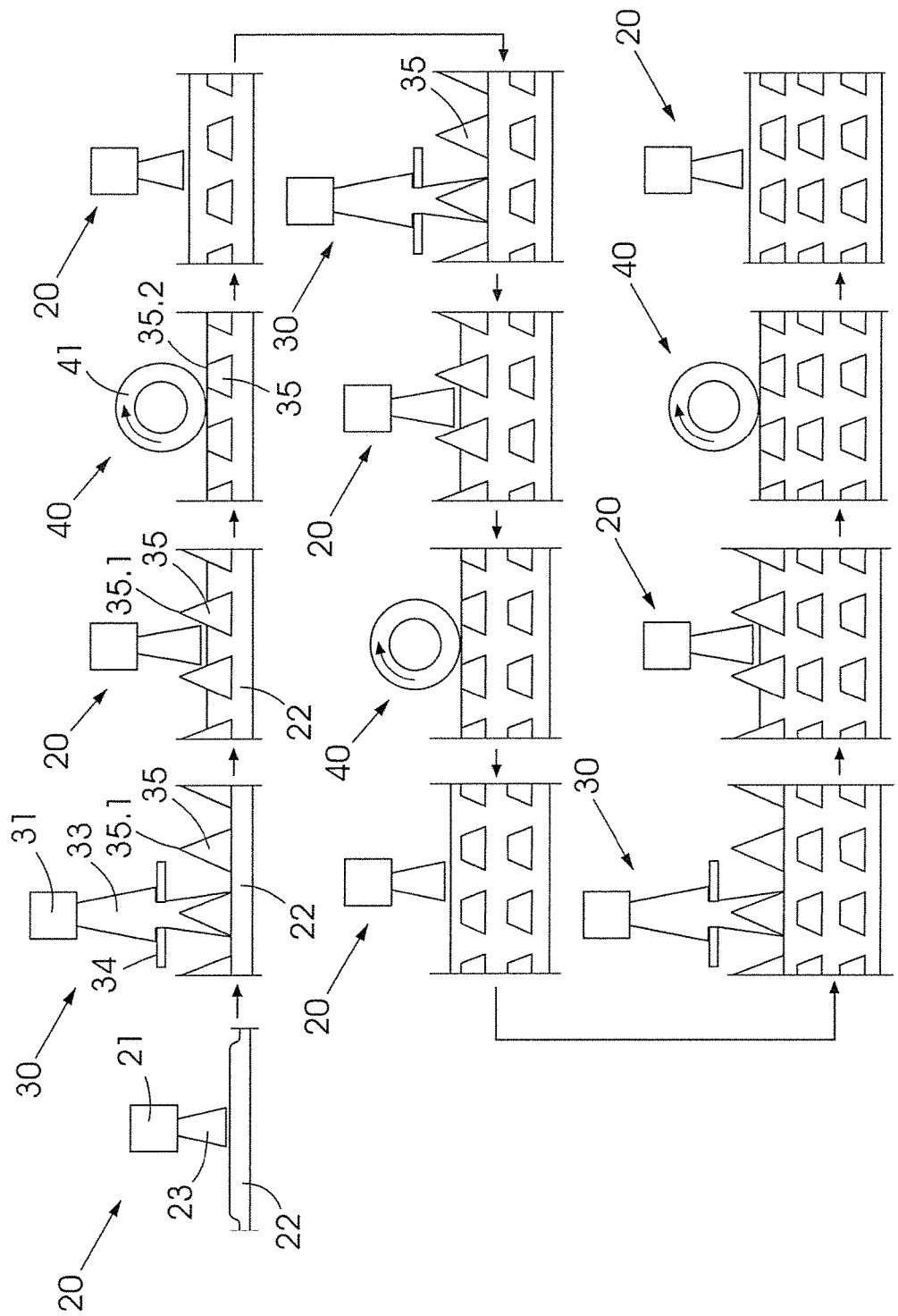
FIG. 6 shows the steps of the method in accordance with the invention, utilizing the cold spray setups of FIGS. 4 and 5.

Generically, the method (depicted by sequence 10 in FIG. 6) comprises a number of iterative sequences, and commences by the deposition of a first material 23 (for example copper) to form a first substrate using the setup 20 described with reference to FIG. 4. Next, a second material 33 (for example aluminium) is deposited onto the first substrate 22 using the setup 30 described with reference to FIG. 5. In this step the material 33 is deposited through a mask 34, resulting in the formation of a plurality of spaced apart and discrete ridges or hillocks 35 formed on the first substrate 22. These ridges or hillocks 35 are generally triangular when viewed in cross-section. Thereafter, a further layer(s) of the first material 23 is deposited onto the workpiece to a level where it covers at least part of the ridges or hillocks 35. It is envisaged that the further layer may even cover the ridges or hillocks 35 in totality. During a subsequent grinding step 40, a grinding tool 41 is used to grind the protruding tips 35.1 of the ridges or hillocks 35 to a predetermined height, in order for the new upper edge 35.2 of the ridges 35 to define upper ends of now trapezoidal shaped ridges or hillocks 35. A further layer of the first material is subsequently deposited onto the work piece, and the sequence is repeated until a desired number of trapezoidal rows of ridges or hillocks 35 have been formed.

Once the above process has been completed, the second material is de-alloyed and as such removed from the work piece using a suitable chemical process. For example, if the base material (first material) is copper, and the intermediate material (second material) is aluminium, the aluminium can be removed using 30% diluted hydrochloric acid. In this way a copper body is formed, having a plurality of trapezoidally cross-sectioned microchannels provided therethrough.

SPECIFIC EXAMPLE

A specific, but non-limiting, example of how the above method was put into practice is now described in more detail below.

In order to develop the new method for microfabrication of microchannels, the following tasks were carried out:
suitable metal powders were selected;
cold spraying process parameters were optimized;
alloying was done using cold spraying processes (as shown in FIGS. 4 and 5);
de-alloying was effected in order to fabricate the microchannels; and
products were characterised.

The following materials and equipment were used:
metal powders (Copper matrix former as a first metal; Aluminium as a second metal; a microchannels forming agent; and Alumina grit blast for activation of substrate surface);
consumable materials: distilled water, and dilute hydrochloric acid (30%) for de-alloying; and
equipment (cold spraying equipment from Centerline, Canada; slotted mask; surface grinder; and an optical microscope).

The optimisation of the cold spraying fabrication process was conducted to establish optimal spray parameters. The process parameters considered during laboratory experiment included:
gas temperature ($T_0$);
gas pressure ($P_0$);
standoff distance between gun and mask (SDGM);
standoff distance between the substrate and mask (SDSM);
standoff distance between gun and substrate (SDGS);
traversing speed of the gun (V); and
powder feed rate (F).

During these trials, aluminium (Al) powder was sprayed through the mask onto the activated copper (Cu) substrate to fabricate the Al ridges. The optimised parameters from this process were recorded when the width of the fabricated Al ridges were less or equal to 120% the width of the slots of the mask. Also, at this point, it was ensured that the geometric profile of the ridges was consistent and that there was no overspray of Al powder.

Furthermore, during optimisation of Cu deposition, Cu was sprayed without the mask, and the optimised parameters were recorded when rapid build-up of Cu coating occurred and the colour of the coating did not change to brown. During copper cold spray coatings, the coating surface present different colors attributed to the different surface temperatures of coatings deposited at different standoff distances. A relatively high temperature causes the oxidation and this could be observed at a shorter standoff distance. In this example, because the colour didn't change to brown, it indicates a good coating.

In all these trials, single factor variation of process parameters was implemented. The optimal CS process parameters are shown in Table 1.

TABLE 1

Optimal process parameters for Al and Cu.

| Powder | $T_0$ (° C.) | $P_0$ (bars) | $SD_{GM}$ (mm) | $SD_{SM}$ (mm) | $SD_{GS}$ (mm) | V (mm/s) | F (%) |
|---|---|---|---|---|---|---|---|
| Al | 390 | 8 | 25 | 2 | — | 10 | 5 |
| Cu | 400 | 9.5 | — | — | 10 | 10 | 40 |

The next step in the new method consists in the microfabrication of microchannels using the alloy-de-alloy concept. In this process, a cold spraying process was used to alloy Al into a Cu matrix and de-alloying was accomplished by etching specimens in acid to selectively dissolve the Al. Initially, the Cu substrate was activated by grit blasting using Alumina powder and spray parameters for Al as shown in Table 1. To alloy, the spray parameters given in Table 1 were used to alternately deposit Al and Cu according to the process sequence illustrated in FIG. 6.

The alloying steps consisted of the following steps:
1. Spray three layers Cu powder;
2. Through the slotted mask, spray one layer of Al powder to fabricate the Al ridges;
3. Without the mask, spray three layers of Cu to burry bottom potion of the ridges. This determines the depth of the trapezoidal microchannels;
4. Grind off the protruding tips of the Al coatings to make the trapezoidal ridges;
5. Repeat step 1 to 4 until there are three layers of Al ridges;
6. Without the mask, spray three layers of Cu to cover the top layer of Al ridges; and
7. Lightly grind the periphery of the specimen to expose the cross sections of the Al ridges.

The de-alloying steps consisted of the following steps:
8. Immerse the specimen in 30% dilute hydrochloric acid to dissolve the Al ridges;
9. Repeat step 8 until there are no more bubbles forming around the specimen; and
10. rinse the specimen in distilled water.

The process was followed by the analysis of the microfabricated channels. The microfabricated specimens were sectioned, metallographically polished and then characterised for morphology by taking images using the Optical Microscope (OM). The geometric dimensions of the microchannels were measured using the OM. Ten measurements each side were taken and averaged. These measurements were used to computationally model the microchannels to mimic the micro heat sink. To evaluate the cooling capability of the modelled micro heat sink, de-ionised water was chosen as the cooling fluid flowing through the microchannel. Flow was assumed to be laminar and the forced convection heat transfer coefficient which was calculated under these conditions was 7,246 W/m$^2$·K. Heat flux densities of 100, 200, 300, 400, and 500 W/m$^2$ which represent the heat fluxes emitted by the microprocessors to the micro heat sink were applied. The ambient temperature was taken to be 20° C.

Figure 7A:
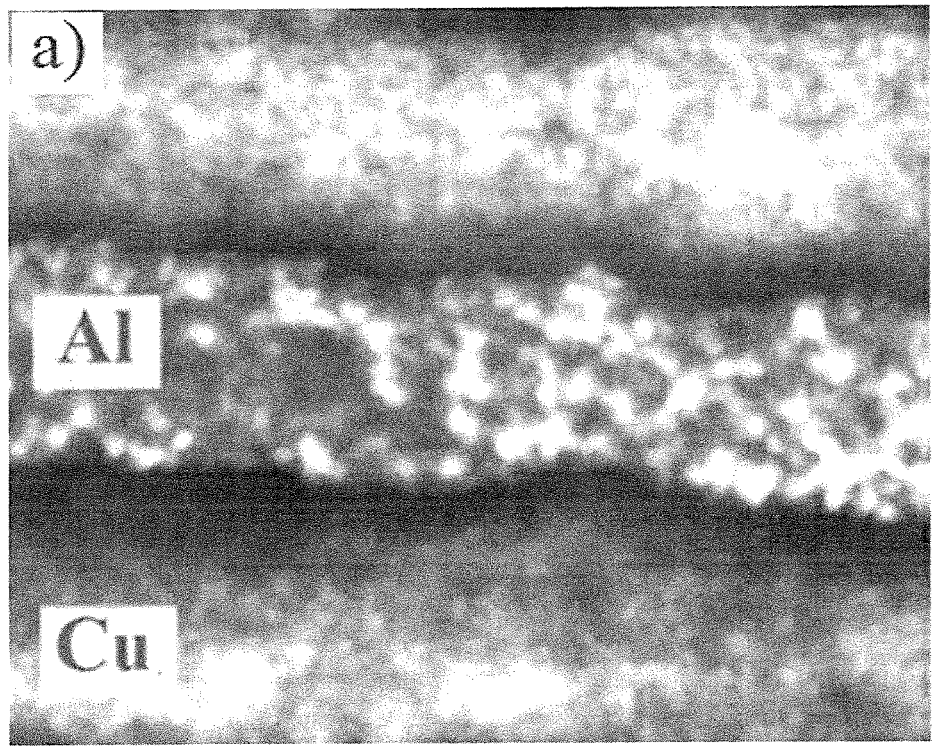
FIG. 7a is a photograph of a cross-section through the manufactured object in an intermediate state, before the second metal has been removed from the object.
Figure 7B:
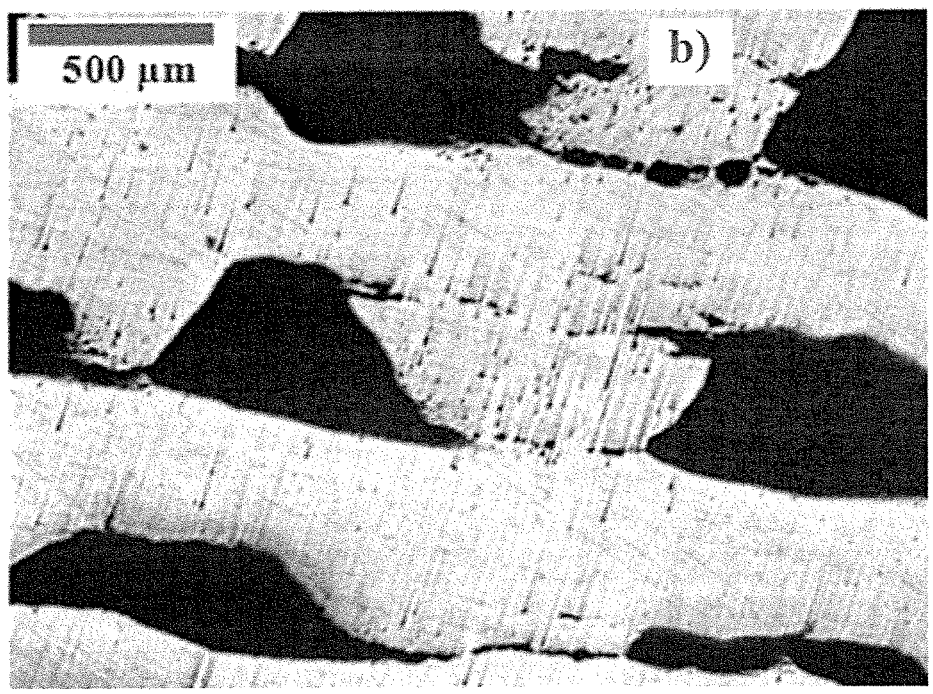
FIG. 7b is a photograph of a cross-section through the manufactured object in a final state, once the second metal has been removed from the object, and in which trapezoidal microchannels are visible.
Figure 8A:
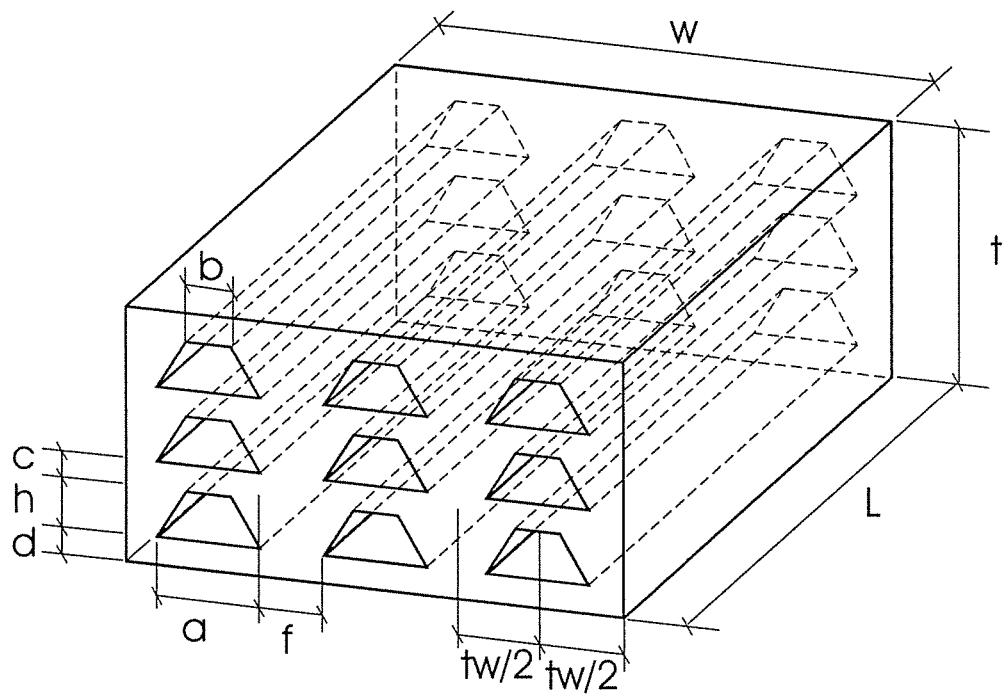
FIG. 8a shows the geometry of the heat sink with microchannels provided therethough based on the manufactured heat sink of FIG. 7b.
Figure 8B:
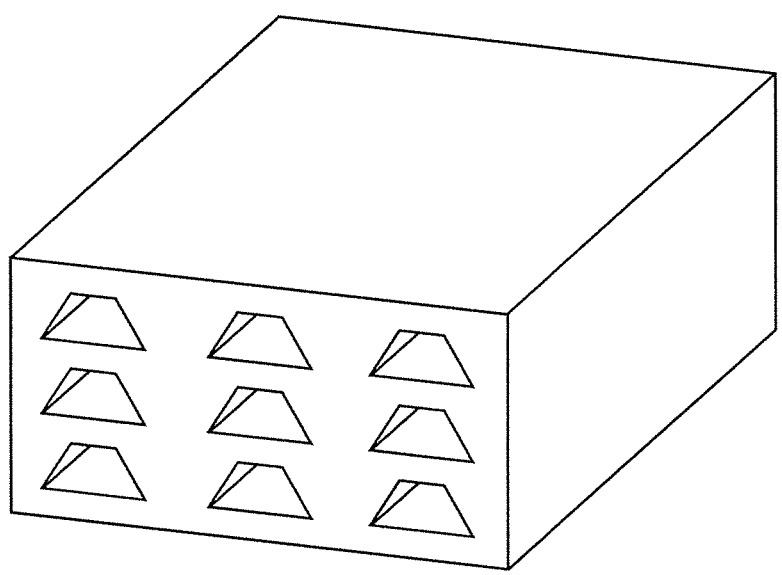
Figure 9A:
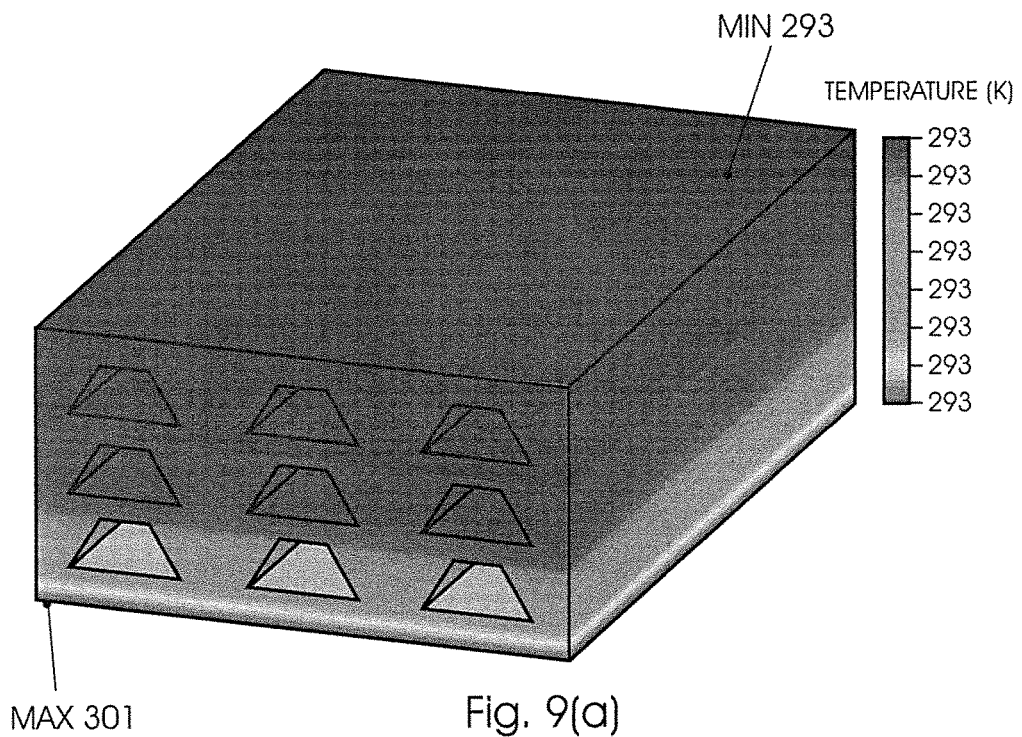
FIG. 9 depicts the temperature distribution through the heat sink achieved by way of a computational simulation.
Figure 9B:
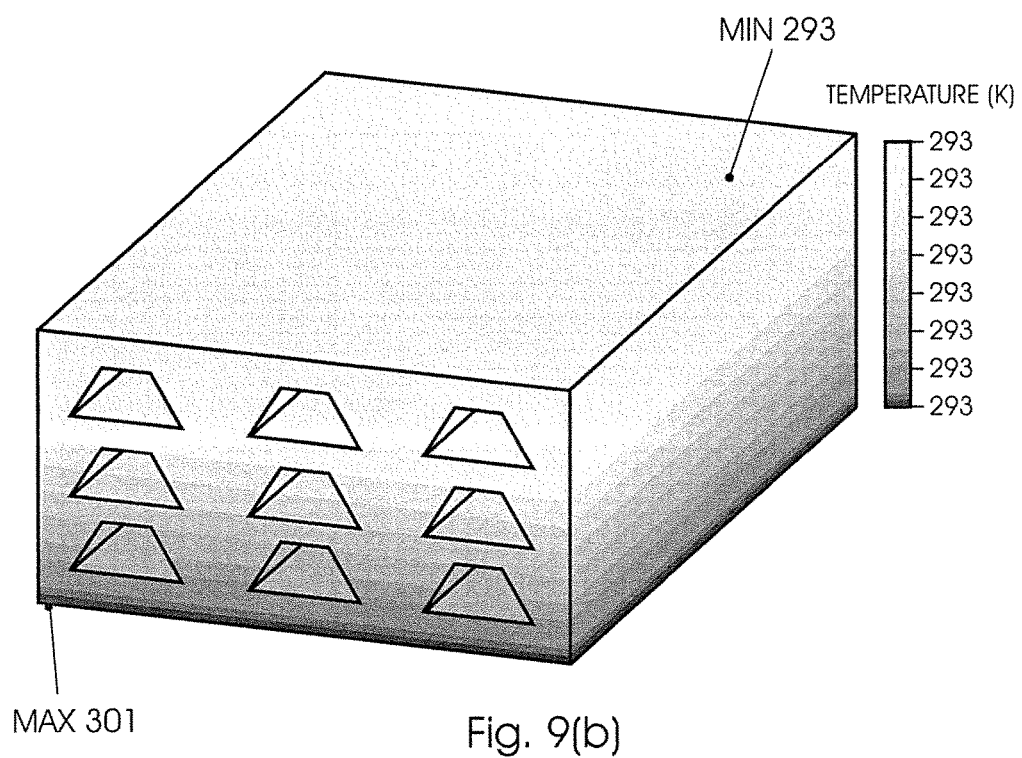

Based on process route presented above, the Al ridges were alloyed inside the Cu matrix and the insertion before de-alloying is shown in FIG. 7a. After de-alloying, a three-layered porous Cu microchannel with trapezoidal sections was fabricated, and their cross section is shown in FIG. 7b. The average dimensions of each side of these microchannels were acquired and are shown in Table 2. These measurements related to the geometric structures of the modelled micro heat sinks are shown in FIG. 8a. FIG. 8b shows the computational model of the Cu micro heat sink. Furthermore, the simulated variation of heat flux with junction and surface temperature of the Cu micro heat sink are shown in Table 3, and FIG. 9 depicts the temperature profile on the surface of the micro heat when the maximum heat flux of 500 W/m$^2$ is applied to the micro heat sink by the microprocessor.

TABLE 2

Geometric dimensions for fabricated microchannels (relate to FIG. 8a)

| | Dimension | | | | | | | | | |
|---|---|---|---|---|---|---|---|---|---|---|
| | a | b | c | d | e | h | w | l | t | $t_w$ |
| μm | 1091 | 443 | 300 | 400 | 650 | 436 | 4 132 | 7500 | 2708 | 870 |

TABLE 3

Variation of heat flux with temperature of the Cu— micro heat sink

| Heat Flux Q W/cm$^2$ | 100 | 200 | 300 | 400 | 500 |
|---|---|---|---|---|---|
| Junction Temp (° C.) | 22 | 22 | 25 | 27 | 28 |
| Surface Temp (° C.) | 20 | 20 | 20 | 20 | 20 |

In addition to the examples given above, there are several other combinations of metals that could be used in this respect including gold, silver and nickel. Nickel has already been sprayed combined with other metals, while silver can also be sprayed. From these results, it is probable that other metals such as gold can be sprayed when combined with other metals such as copper or nickel as binders. Spraying of metal mixtures is also possible. Further, besides aluminium, several other metals can be preferentially etched out of the matrix or their combinations of metals as illustrated in the following pairs:

| First (base) material | Second (removed) material | De-alloying chemical |
|---|---|---|
| Gold & Copper | Aluminium | Sulfide solutions |
| Gold & Copper | Zinc | NaOH, Na2SO4, and salty NaCl |
| Silver | Copper | Hydrofluoric acids |
| Silver | Aluminium | Hydrochloric acid |
| Nickel | Zinc | Dilute Nitric Acid |
| Nickel | Aluminium | Sulphuric Acid |
| Copper | Aluminium | Hydrochloric acid |
| Copper | Zinc | Hydrochloric acid |
| Aluminium | Zinc | Hydrochloric acid |

Currently available commercial techniques, such as stereolithography, selective laser sintering, or fused deposition manufacturing, are able only to produce prototypes using wax, plastic, nylon, paper, polycarbonate materials, etc. However, material melting and solidification created difficulties that have hindered the widespread adoption of these techniques. There are many difficulties that must be addressed when attempting to use these techniques with materials with high melting temperature such as metal. Also, their applicability is restricted by high costs, as well as the production of toxic waste. The chemical etching method has very low productivity and the process does not lend itself to precise control of the geometric dimensions of the fabricated microchannels. Micro-machining of microchannels is particularly suitable for low volume production and has drawbacks such as limited tool geometries which make it difficult to fabricate microchannels with sizes below 500 microns. Consequently, the newly developed method for fabrication of microchannels has different process routes to those of stereolithography, chemical etching and micro-machining processes. In addition, Cu/Al is one of the preferred embodiments due to the fact that Copper is ideally suited to cold spraying and the resulting coating possesses excellent electrical and thermal conductivity.

The new method is a hybridisation of additive and subtractive microfabrication and so this new method could be added as a new group of microfabrication technological process.

The simulation of the fabricated microchannels indicate very high heat transfer capability since they can keep the mean temperature of the microprocessor at 4° C. above ambient temperature, and which it is far below the critical temperatures of 55-100° C. required for the commercially available microprocessors (Mihai 2011). The cooling capability is also in line with the microfluidic cooling systems that have superior thermal extraction capability compared to any other thermal solution (Upadhya et al. 2006).

In addition, and unlike other microfabrication technologies presented in the published literature, this new method for the fabrication of microchannels offers:

repeatability of the geometric profile requirements for specific microchannels' design;

high production flexibility since the process parameters could be independently altered which result in microchannels with different geometric dimensions; and a very short throughput time, thereby making it a very strong candidate for mass production of micro heat sinks.

It will be appreciated that the above is only one embodiment of the invention and that there may be many variations without departing from the spirit and/or the scope of the invention.

REFERENCES

Asgari, O., and Saidi, M. H., 2009, *Approximate method of determining the optimum cross section of microchannel heat sink*, Journal of Mechanical Science and Technology, vol. 23, pp. 3448-3458, KSME & Springer.

Gaikwad, V. P., 2014, *Microchannel heat sink fabrication techniques, Second International Conference on Emerging Trends in Engineering*, IOSR Journal of Mechanical and Civil Engineering, ISSN: 2278-1684, pp: 51-57, www.iosrjournals.org.

Gargi, H., Negi, V. S., Nidhi, and Lail, A. K, 2013, *Numerical Study of Microscale Heat Sinks Using Different Shapes & Fluids*, Central Scientific Instruments Organisation (CSIR-CSIO), Excerpt from the Proceedings of the 2013 COMSOL Conference in Bangalore, India.

Ioan M., 2011, *Heat Transfer in Minichannels and Microchannels CPU Cooling Systems*, Heat Transfer Theoretical Analysis, Experimental Investigations and Industrial Systems, ISBN: 978-953-307-226-5.

Papyrin, A., Kosarev, V., Klinkov, S., Alkhimov, A., and Fomin, V., 2006, *Cold Spray Technology*, Summer Universities, ENISE, St-Etienne, France Prakash S. and Kumar S. (2014) Fabrication of microchannels: A review. Proceedings of the Institution of Mechanical Engineers, Part B: Journal of Engineering Manufacture. OnlineFirst Version of Record—June 17.

Upadhya, G., Munch, M., Zhou, P., Hom, J., Werner, D., and McMaster, M., 2006, *Micro-Scale Liquid Cooling System for High Heat Flux Processor Cooling Applications*, 116 22nd IEEE Semi-therm Symposium, Mountain View, Calif. 94043.

Zhao, C. Y., and Lu, T. J., 2002, *Analysis of microchannel heat sinks for electronics cooling, International* Journal of Heat and Mass Transfer, vol. 45, pp. 4857-4869.

Zhou, W., Deng, W., Lu, L., Zhang, J., Qin L., Ma, S., and Tang, Y., 2014, *Laser micro-milling of Microchannel on copper sheet as catalyst support used in microreactor for hydrogen production*, International Journal of Hydrogen Energy, vol. 39, pp. 4884-4894, ScienceDirect.

The invention claimed is:

1. A method of manufacturing an object with microchannels provided therethrough, the method comprising the steps of:
   providing a metal base layer made from a first metal;
   forming a plurality of spaced apart ridges, made from a second metal, on the base layer by depositing the second metal onto the base layer by way of a cold spraying process;
   depositing more of the first metal onto the ridges in order to fill up a space between the ridges;
   removing upper zones of the ridges, as well as the corresponding first metal located between the ridges;
   depositing more of the first metal onto the ridges in order to cover the ridges; and
   removing the ridges using a chemical etching process so as to produce microchannels in a body made of the first metal.

2. The method of claim 1, wherein the second metal is deposited through a mask having parallel and spaced apart slots provided therethrough, in order to form the plurality of spaced apart ridges on the base layer.

3. The method of claim 1, wherein a sequence of depositing the first metal and the second metal is repeated until a plurality of layers of ridges have been formed before the ridges are removed by way of chemical etching, so as to form a three dimensional network of microchannels in the first metal.

4. The method according to claim 1, wherein the ridges are of elongate configuration.

5. The method according to claim 1, wherein the ridges are parallel relative to one another.

6. The method according to claim 1, wherein the metal base layer comprises a solid metal substrate made from the first metal.

7. The method according to claim 1, wherein the metal base layer is formed by depositing one or more layers of the first metal by way of a surface coating process.

8. The method according to claim 1, wherein the second metal comprises aluminum, zinc, copper, or any combination thereof.

9. The method according to claim 1, wherein the first metal comprises copper and the second metal comprises aluminum.

10. The method of claim 1, wherein the upper zones of the ridges, the first metal layer, or both, are removed by grinding.

11. The method of claim 1 further comprising a step of removing upper zones of the ridges before the step of depositing more of the first metal onto the ridges in order to cover the ridges.

12. The method of claim 11, wherein the upper zones of the ridges, the first metal layer, or both, are removed by grinding.

13. The method of claim 1, wherein the ridges are substantially triangular in cross-section.

14. The method of claim 13, wherein the ridges are substantially trapezoidal in cross-section once the upper zones or apexes of the ridges have been removed.

15. The method according to claim 1, wherein the first metal comprises copper, gold, silver, nickel, aluminum or any combination thereof.

16. The method according to claim 15, wherein the second metal comprises aluminum, zinc, copper, or any combination thereof.

\* \* \* \* \*